US010648071B2

(12) United States Patent
Johanson et al.

(10) Patent No.: US 10,648,071 B2
(45) Date of Patent: May 12, 2020

(54) PROCESS KIT HAVING A FLOATING SHADOW RING

(71) Applicant: APPLIED MATERIALS, INC., Santa Clara, CA (US)

(72) Inventors: William Johanson, Gilroy, CA (US); Siew Kit Hoi, Singapore (SG); John Mazzocco, San Jose, CA (US); Kirankumar Savandaiah, Bangalore (IN); Prashant Prabhu, Karwar (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 209 days.

(21) Appl. No.: 15/814,696

(22) Filed: Nov. 16, 2017

(65) Prior Publication Data
US 2018/0142340 A1 May 24, 2018

(30) Foreign Application Priority Data
Nov. 19, 2016 (IN) .............................. 201611039546

(51) Int. Cl.
H01J 37/34 (2006.01)
C23C 14/04 (2006.01)
H01J 37/32 (2006.01)
C23C 14/34 (2006.01)

(52) U.S. Cl.
CPC ............ C23C 14/042 (2013.01); C23C 14/34 (2013.01); H01J 37/32477 (2013.01); H01J 37/34 (2013.01)

(58) Field of Classification Search
CPC .. H01J 37/32477; H01J 37/34; H01J 37/3441; H01J 37/3447; C23C 14/042; C23C 14/34

USPC .............................. 204/298.11; 118/720, 721
See application file for complete search history.

(56) References Cited

U.S. PATENT DOCUMENTS

| 5,922,133 A * | 7/1999 | Tepman | ................... C23C 14/50 118/503 |
| 6,296,712 B1 * | 10/2001 | Guo | ....................... C23C 16/455 118/728 |
| 2004/0003780 A1 | 1/2004 | Yudovsky et al. | |
| 2008/0178801 A1 | 7/2008 | Pavloff et al. | |

(Continued)

FOREIGN PATENT DOCUMENTS

| CN | 105506570 A | 4/2016 |
| JP | 2002-294441 A | 10/2002 |

OTHER PUBLICATIONS

Machine Transaltion of JP 2002-294441 (Year: 2002).*
International Search Report and Written Opinion dated Feb. 8, 2018 received for Application PCT/US2017/061979.

Primary Examiner — Rodney G McDonald
(74) Attorney, Agent, or Firm — Moser Taboada; Alan Taboada

(57) ABSTRACT

Embodiments of process kits and process chambers incorporating same are provided herein. In some embodiments, a process kit includes an adapter having an adapter body and a shield portion radially inward of the adapter body; a heat transfer channel formed in the adapter body; a shadow ring coupled to the adapter such that the shield portion of the adapter extends over a portion of the shadow ring; and a ceramic insulator disposed between the shadow ring and the adapter to electrically isolate the shadow ring from the adapter.

20 Claims, 6 Drawing Sheets

(56) References Cited

U.S. PATENT DOCUMENTS

2011/0278165 A1    11/2011   Rasheed et al.
2015/0170955 A1*   6/2015   Ouye ................ H01L 21/68785
                                                                              438/464

* cited by examiner

PROCESS KIT HAVING A FLOATING SHADOW RING

CROSS-REFERENCE TO RELATED APPLICATIONS

This application claims benefit of Indian provisional patent application serial number 201611039546, filed Nov. 19, 2016, which is herein incorporated by reference in its entirety.

FIELD

Embodiments of the present disclosure generally relate to substrate processing equipment.

BACKGROUND

A process kit shield may be used in, for example, a physical vapor deposition (PVD) chamber to separate a processing volume from a non-processing volume. In PVD chambers configured to deposit aluminum on a substrate, the process kit shield may be fabricated, for example, from stainless steel (SST). The SST process kit shield can be recycled multiple times as an aluminum layer deposited on the process kit shield during processing can be preferentially etched away from the base SST shield material. However, the inventors have been working on depositing relatively thick aluminum films on the substrate using significantly increased process power and deposition time as compared to conventional aluminum deposition processes.

For the thicker aluminum deposition process, the inventors have observed that the temperature of the process kit shield goes sufficiently high to undesirably result in whisker growth on the substrate. The inventors believe that whiskers are formed when the process kit surrounding the substrate does not have sufficient time to cool down between subsequent processes. The deposition process heats the substrate significantly more than the heated substrate support. Because the substrate is electrostatically chucked to the pedestal, the wafer is not free to bow under the thermal stress caused by the mismatch in the coefficient of thermal expansion (CTE) between the thick aluminum film and the substrate (e.g., silicon). When the film stress on the substrate gets high enough, whiskers pop out of the film to reduce the film stress. The inventors have further observed that high temperatures in the structures surrounding the substrate also adversely affect the reflectivity of the aluminum film deposited on the substrate. For example, the inventors have observed that the temperature of the cover ring and shield play an important role in cooling the substrate via thermal radiation, and in minimizing whisker formation.

Accordingly, the inventors have provided embodiments of improved process kit.

SUMMARY

Embodiments of process kits and process chambers incorporating same are provided herein. In some embodiments, a process kit includes an adapter having an adapter body and a shield portion radially inward of the adapter body; a heat transfer channel formed in the adapter body; a shadow ring coupled to the adapter such that the shield portion of the adapter extends over a portion of the shadow ring; and a ceramic insulator disposed between the shadow ring and the adapter to electrically isolate the shadow ring from the adapter.

a chamber wall defining an inner volume within the process chamber, wherein the chamber wall is grounded; a sputtering target disposed in an upper section of the inner volume; a substrate support having a support surface to support a substrate below the sputtering target; and a process kit. The process kit includes: an adapter having an adapter body coupled to the chamber wall and a shield portion radially inward of the adapter body; an heat transfer channel formed in the adapter body; a shadow ring coupled to the adapter and surrounding the substrate support such that the shield portion of the adapter extends over a portion of the shadow ring; and a ceramic insulator disposed between the shadow ring and the adapter to electrically isolate the shadow ring from the adapter.

an electrically conductive adapter having an adapter body and a shield portion radially inward of the adapter body; a coolant channel formed in the adapter body; an electrically conductive shadow ring coupled to the adapter; a ceramic insulator disposed between the shadow ring and the adapter to electrically isolate the shadow ring from the adapter; and a deposition ring having an upper surface configured to interface with a lower surface of the shadow ring to form a tortuous path between the deposition ring and the shadow ring, wherein the shield portion extends over a portion of the shadow ring.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
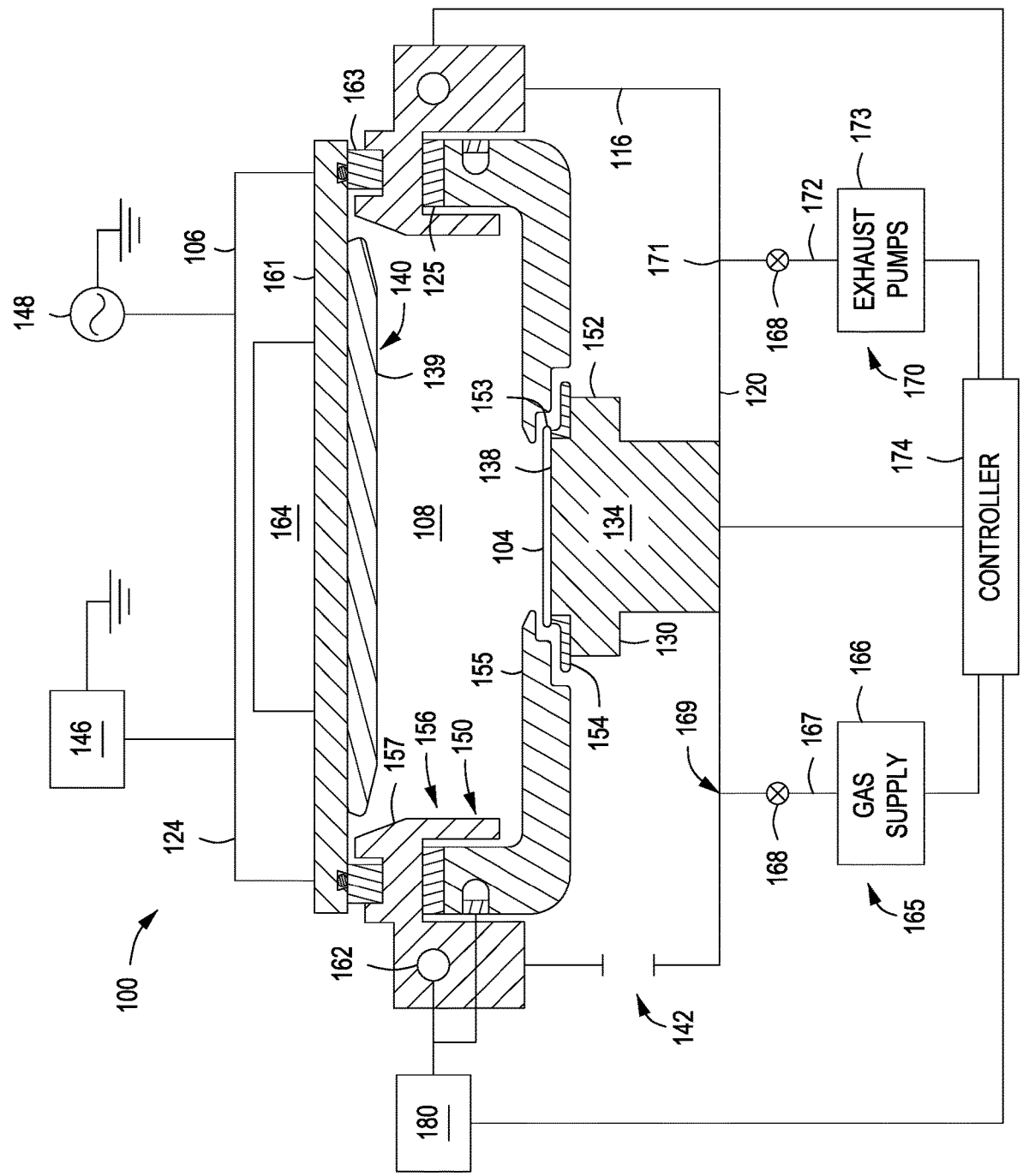
FIG. 1 depicts a schematic cross sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process kits and process chambers incorporating such process kits are provided herein. In some embodiments, a process kit including a cooled shadow ring and an adapter having a shield portion to shield a portion of the cooled shadow ring is provided herein. In some embodiments, a process kit including a shadow ring coupled to an adapter having a shield portion to shield a portion of the shadow ring is provided herein. The adapter section may include a heat transfer channel to cool the one-piece process kit shield. The process kit advantageously improves cooling of the shadow ring, which is the closest component of the process kit to a substrate supported on a substrate support for processing.

FIG. 1 depicts a schematic, cross-sectional view of an illustrative process chamber 100 (e.g., a PVD chamber) having a process kit in accordance with some embodiments of the present disclosure. Examples of PVD chambers suitable for use with process kits of the present disclosure include the ALPS® Plus, SIP ENCORE®, and other PVD processing chambers commercially available from Applied Materials, Inc., of Santa Clara, Calif. Other processing chambers from Applied Materials, Inc. or other manufactures may also benefit from the inventive apparatus disclosed herein.

The process chamber 100 comprises chamber walls 106 that enclose an inner volume 108. The chamber walls 106 include sidewalls 116, a bottom wall 120, and a ceiling 124. The ceiling 124 may be a chamber lid or a similar cover to seal off the inner volume 108. The process chamber 100 can be a standalone chamber or a part of a multi-chamber platform (not shown) having a cluster of interconnected chambers connected by a substrate transfer mechanism that transfers substrates 104 between the various chambers. The process chamber 100 may be a PVD chamber capable of sputter depositing material onto a substrate 104. Non-limiting examples of suitable materials for sputter deposition include one or more of aluminum, copper, tantalum, tantalum nitride, titanium, titanium nitride, tungsten, tungsten nitride, and the like.

The process chamber 100 comprises a substrate support 130 which comprises a pedestal 134 to support the substrate 104. The pedestal 134 has a substrate support surface 138 having a plane substantially parallel to a sputtering surface 139 of a sputtering target 140 disposed in an upper section of the process chamber 100. The substrate support surface 138 of the pedestal 134 receives and supports the substrate 104 during processing. The pedestal 134 may include an electrostatic chuck or a heater (such as an electrical resistance heater, heat exchanger, or other suitable heating device). In operation, a substrate 104 is introduced into the process chamber 100 through a substrate loading inlet 142 in the sidewall 116 of the process chamber 100 and placed onto the substrate support 130. The substrate support 130 can be lifted or lowered by a support lift mechanism and a lift finger assembly can be used to lift and lower the substrate 104 onto the substrate support 130 during placement of the substrate 104 on the substrate support 130 by a robot arm. The pedestal 134 can be maintained at an electrically floating potential or grounded during plasma operation.

The process chamber 100 also contains a process kit 150, which comprises various components that can be easily removed from the process chamber 100, for example, to clean sputtering deposits off the component surfaces, replace or repair eroded components, or to adapt the process chamber 100 for other processes. The inventors have discovered that thermal resistances at contact interfaces between a process kit adapter and a process kit shadow ring adversely affect shadow ring temperatures. Furthermore, low clamping forces between the adapter and the shadow ring result in poor heat transfer between the adapter and the shadow ring, even with coolant channels used to enhance heat transfer rates. The low heat transfer rate problem is further exacerbated with respect to the shadow ring because the shadow ring is a floating element (i.e., not electrically coupled to the adapter) that is further removed from the cooled adapter. The inventors have also discovered that a shadow ring electrically coupled to the adapter brings the ground plane close to an edge of the substrate, thus adversely affecting the electrical field near the edge of the substrate. As a result, the plasma proximate the substrate is distorted leading to deposition non-uniformity. Thus, the inventors have designed a process kit having a cooled adapter and a cooled shadow ring to improve the cooling of the process kit.

Figure 2:
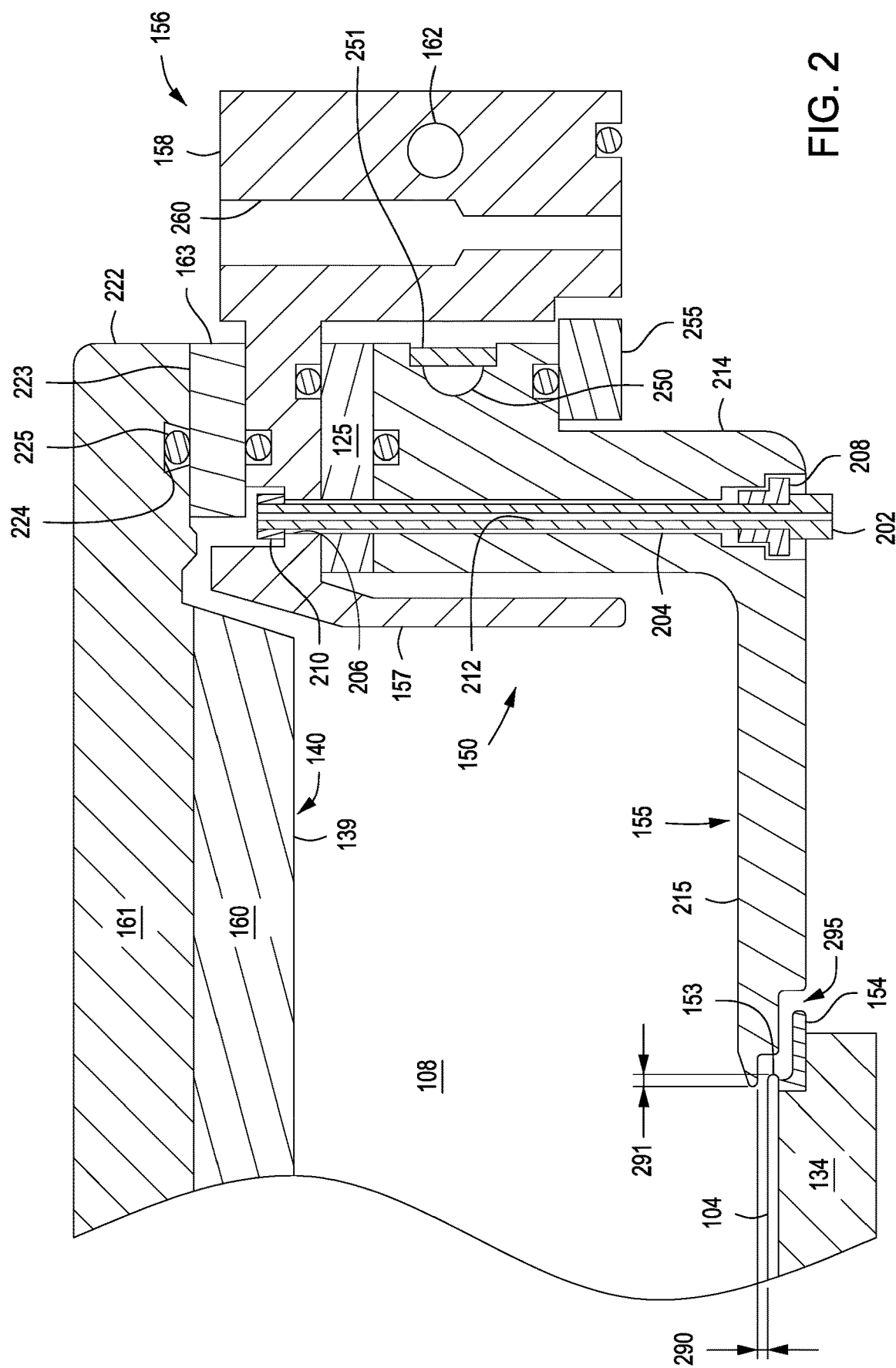
FIG. 2 depicts a schematic cross sectional view of a process kit in accordance with some embodiments of the present disclosure.

FIG. 2 depicts a cross-sectional view of a process kit 150 in accordance with some embodiments of the present disclosure. Referring to FIGS. 1 and 2, in some embodiments, the process kit 150 includes an adapter 156 having and adapter body 158 and a shield portion 157 radially inward of the adapter body 158. The adapter body 158 is coupled to and grounded through the chamber sidewalls 116. In some embodiments, the adapter body 158 may include a plurality countersunk holes 260 (one shown in FIG. 2) into which a bolt (not shown) can be inserted to couple the adapter 156 to the sidewalls 116. To facilitate cooling of the adapter 156, a heat transfer channel 162 is formed through the adapter body 158 and is fluidly coupled to a heat transfer medium supply 180 to flow a heat transfer medium through the heat transfer channel 162. In some embodiments, the heat transfer medium supply 180 supplies coolant to the heat transfer channel 162 to cool the adapter 156. The adapter 156 may be formed of a thermally conductive material such as, for example, aluminum, stainless steel, copper, and the like.

The process kit 150 also includes a shadow ring 155 coupled to the adapter 156 via a fixation element such as, for example, a plurality of bolts 202 (one shown in cross section of FIG. 2). Each bolt 202 extends through a corresponding first hole 204 and a corresponding second hole 206 in the adapter 156 aligned with the first hole 204 and is fixed using a retaining plate 210. The diameters of the first and second holes 204, 206 may be larger than a diameter of the bolt 202 to allow for thermal expansion of the bolt 202 during processing and to prevent any possible electrical coupling of the shadow ring 155 to the adapter 156 via the bolt 202, which would ground the shadow ring 155 and result in non-uniformities in the plasma due to a skewed electrical field at the edge of the substrate 104. In some embodiments, a ceramic bushing 208 may be disposed between the head of the bolt 202 and the shadow ring 155 to ensure that the shadow ring 155 remains electrically isolated from the bolt 202 and the adapter 156. In some embodiments, each bolt 202 may include a through hole 212 to prevent outgassing in areas around the bolt 202. A first ceramic insulator 125 is disposed between the shadow ring 155 and the adapter 156 to electrically insulate the shadow ring 155 from the grounded adapter 156, thus resulting in an electrically floating shadow ring 155.

The shadow ring 155 includes ring body 214 and protruding section 215 extending radially inward from a lower portion of the ring body 214. In some embodiments, a second heat transfer channel 250 is formed in the ring body 214 to flow a heat transfer medium supplied by the heat transfer medium supply 180 and further facilitate control of the temperature of the shadow ring 155. In some embodiments, the second heat transfer channel 250 is milled into an outer wall of the ring body 214 and a cap 251 is placed atop the second heat transfer channel 250 to seal the channel.

When a coolant flows through both heat transfer channels 162, 250, additional control over the temperature of the shadow ring 155 is achieved. Although the shadow ring is supported by the adapter 156, part of the shadow ring 155 rests on the sidewalls 116. However, to ensure that the shadow ring 155 remains electrically floating, a second ceramic insulator 255 is disposed between the shadow ring 155 and the sidewalls 116 so that the shadow ring 155 does not contact the sidewalls 116 directly. The shadow ring 155 may be formed of a thermally conductive material such as, for example, aluminum, stainless steel, copper, and the like. As depicted in FIG. 2, a plurality of grooves 224 and corresponding o-rings 225 are disposed at various interfaces to ensure the inner volume 108 is properly sealed off from the surrounding environment.

To further alleviate the heating of the shadow ring 155 resulting from processing, the shield portion 157 protrudes downward from the adapter body 158 to cover at least a portion of the ring body 214. As a result, the highest temperature that the shadow ring 155 achieves during processing is reduced compared to a scenario in which the ring body 214 is exposed to the inner volume 108 during processing, thus facilitating improved cooling of the shadow ring 155.

In order to help maintain uniformity at the edge of the substrate 104 being processed, a radially innermost portion of the shadow ring 155 is spaced apart from the edge of the substrate 104 by predetermined distances. In some embodiments, the radially innermost portion of the shadow ring 155 is spaced apart from an upper surface of the substrate 104 by a vertical distance 290 between about 0.02 inches and about 0.09 inches. In some embodiments, the vertical distance 290 is about 0.045 inches. In some embodiments, the innermost portion of the shadow ring 155 is spaced apart from the edge of the substrate 104 by a horizontal distance 291 between about 1 mm outside the diameter of the substrate 104 and about 2 mm within the diameter of the substrate. In some embodiments, the horizontal distance 291 is about 1 mm within the diameter of the substrate.

The process kit 150 further comprises a deposition ring 154 disposed below the shadow ring 155. A bottom surface of the shadow ring 155 interfaces with the deposition ring 154 to form a tortuous path 295. The shadow ring 155 at least partially covers the deposition ring 154. The deposition ring 154 and shadow ring 155 cooperate with one another to reduce formation of sputter deposits on the peripheral walls 152 of the substrate support 130 and an overhanging edge 153 of the substrate 104.

As shown in FIGS. 1-5, the sputtering target 140 comprises a sputtering plate 160 mounted to a backing plate 161. The sputtering plate 160 comprises a material to be sputtered onto the substrate 104. The sputtering plate 160 comprises a metal or metal compound. For example, the sputtering plate 160 can be a metal, such as, for example aluminum, copper, tungsten, titanium, cobalt, nickel or tantalum. The sputtering plate 160 can also be a metal compound, such as for example, tantalum nitride, tungsten nitride or titanium nitride.

The backing plate 161 has a support surface 221 to support the sputtering plate 160 and a peripheral ledge 222 that extends beyond the radius of the sputtering plate 160. The backing plate 161 is made from a metal, such as, for example, stainless steel, aluminum, copper-chromium or copper-zinc. The backing plate 161 can be made from a material having a thermal conductivity sufficient to dissipate the heat generated in the sputtering target 140 and/or the backing plate 161. The heat is generated from the eddy currents that arise in the sputtering and backing plates 160, 161 and also from the bombardment of energetic ions from the plasma onto the sputtering surface 139 of the sputtering target 140. The higher thermal conductivity backing plate 161 allows dissipation of the heat generated in the sputtering target 140 to the surrounding structures or even to a heat exchanger which may be mounted behind the backing plate 161 or may be in the backing plate 161, itself. For example, the backing plate 161 can comprise channels (not shown) to circulate a heat transfer fluid therein. A suitably high thermal conductivity of the backing plate 161 is at least about 150 W/mK, for example, from about 220 to about 500 W/mK. Such a thermal conductivity level allows the sputtering target 140 to be operated for longer process time periods by dissipating the heat generated in the sputtering target 140 more efficiently.

In combination with a backing plate 161 made of a material having a high thermal conductivity and low resistivity, or separately and by itself, the backing plate 161 may comprises a backside surface having one or more grooves (not shown). For example, a backing plate 161 could have a groove, such as annular groove, or a ridge, for cooling the backside 141 of the sputtering target 140. The grooves and ridges can also have other patterns, for example, rectangular grid pattern, chicken feet patterns, or simply straight lines running across the backside surface.

In some embodiments, the sputtering plate 160 may be mounted on the backing plate 161 by diffusion bonding, by placing the sputtering and backing plates 160, 161 on each other and heating the sputtering and backing plates 160, 161 to a suitable temperature, typically at least about 150° C. Optionally, the sputtering target 140 may be a monolithic structure comprising a single piece of material having enough depth to serve as both the sputtering plate and backing plate.

The peripheral ledge 222 of the backing plate 161 comprises an outer footing 223 that rests on an isolator 163 in the process chamber 100 (FIGS. 1 and 2). The peripheral ledge 222 contains a groove 224 into which an O-ring 225 is placed to form a vacuum seal. The isolator 163 electrically isolates and separates the backing plate 161 from the process kit 150 and the process chamber 100, and is typically a ring formed of a dielectric or insulative material such as aluminum oxide. The peripheral ledge 222 is shaped to inhibit the flow or migration of sputtered material and plasma species through a gap between the sputtering target 140 and the isolator 163, to impede the penetration of low-angle sputtered deposits into the gap.

Returning to FIG. 1, the sputtering target 140 is connected to one or both of a DC power source 146 and an RF power source 148. The DC power source 146 can apply a bias voltage to the sputtering target 140 relative to the one-piece shield 151, which may be electrically floating during a sputtering process. While the DC power source 146 supplies power to the sputtering target 140, the one-piece shield 151, the substrate support 130, and other chamber components connected to the DC power source 146, the RF power source 148 energizes the sputtering gas to form a plasma of the sputtering gas. The plasma formed impinges upon and bombards the sputtering surface 139 of the sputtering target 140 to sputter material off the sputtering surface 139 onto the substrate 104. In some embodiments, RF energy supplied by the RF power source 148 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies.

In some embodiments, the process chamber 100 may include a magnetic field generator 164 disposed above the sputtering target 140 to shape a magnetic field about the sputtering target 140 to improve sputtering of the sputtering target 140. The capacitively generated plasma may be enhanced by a magnetic field generator 164 in which for example, a permanent magnet or electromagnetic coils may provide a magnetic field in the process chamber 100 that has a rotating magnetic field having a rotational axis that is perpendicular to the plane of the substrate 104. The process chamber 100 may, in addition or alternatively, comprise a magnetic field generator 164 that generates a magnetic field near the sputtering target 140 of the process chamber 100 to increase an ion density in a high-density plasma region adjacent to the sputtering target 140 to improve the sputtering of the target material.

The sputtering gas is introduced into the process chamber 100 through a gas delivery system 165, which provides gas from a gas supply 166 via conduits 167 having gas flow control valves 168, such as a mass flow controllers, to pass a set flow rate of the gas through the gas flow control valves 168. The gases are fed to a mixing manifold (not shown) in which the gases are mixed to from a process gas composition and fed to a gas distributor 169 having gas outlets to introduce the gas into the process chamber 100. The process gas may comprise a non-reactive gas, such as argon or xenon, which is capable of energetically impinging upon and sputtering material from the sputtering target 140. The process gas may also comprise a reactive gas, such as one or more of an oxygen-containing gas and a nitrogen-containing gas, that are capable of reacting with the sputtered material to form a layer on the substrate 104. The gas is then energized by the RF power source 148 to form a plasma to sputter the sputtering target 140. Spent process gas and byproducts are exhausted from the process chamber 100 through an exhaust 170. The exhaust 170 comprises an exhaust port 171 that receives spent process gas and passes the spent gas to an exhaust conduit 172 having a throttle valve to control the pressure of the gas in the process chamber 100. The exhaust conduit 172 is connected to one or more exhaust pumps 173.

Various components of the process chamber 100 may be controlled by a controller 174. The controller 174 comprises program code having instruction sets to operate the components to process a substrate 104. For example, the controller 174 can comprise program code that includes substrate positioning instruction sets to operate the substrate support 130 and substrate transfer mechanism; gas flow control instruction sets to operate gas flow control valves to set a flow of sputtering gas to the process chamber 100; gas pressure control instruction sets to operate the exhaust throttle valve to maintain a pressure in the process chamber 100; gas energizer control instruction sets to operate the RF power source 148 to set a gas energizing power level; temperature control instruction sets to control a temperature control system in the substrate support 130 or the heat transfer medium supply 180 to control a flowrate of the heat transfer medium to the heat transfer channel 162; and process monitoring instruction sets to monitor the process in the process chamber 100.

Figure 3:
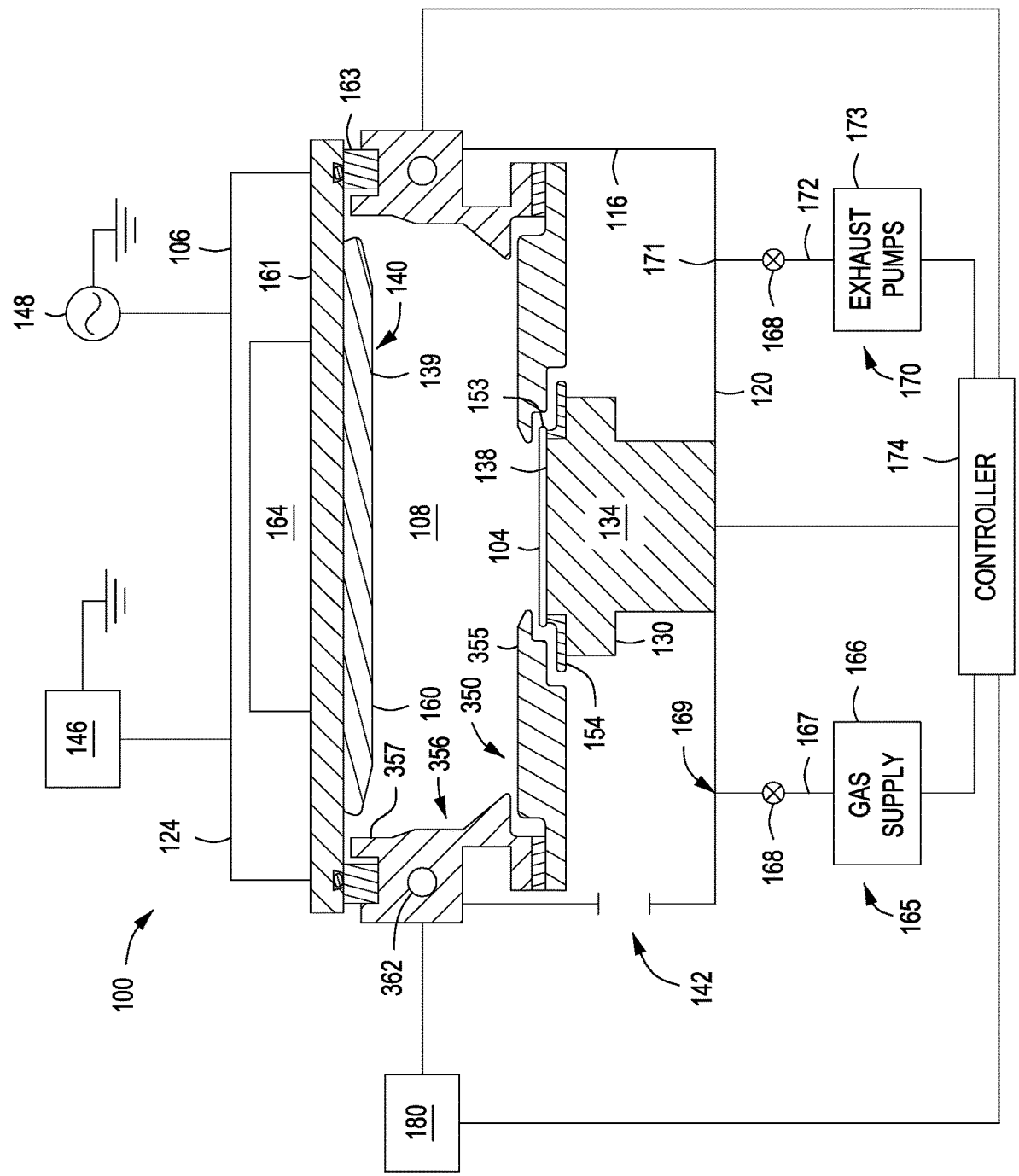
FIG. 3 depicts a schematic cross sectional view of a process chamber in accordance with some embodiments of the present disclosure.

FIG. 3 depicts a schematic, cross-sectional view of the illustrative process chamber 100 (e.g., a PVD chamber) having a process kit 350 in accordance with some embodiments of the present disclosure. Because elements of the process chamber 100 are similar or identical to those shown in FIG. 1 and discussed above, these elements are labeled similarly and a description of the similar elements will be omitted for the sake of clarity and brevity.

Figure 4:
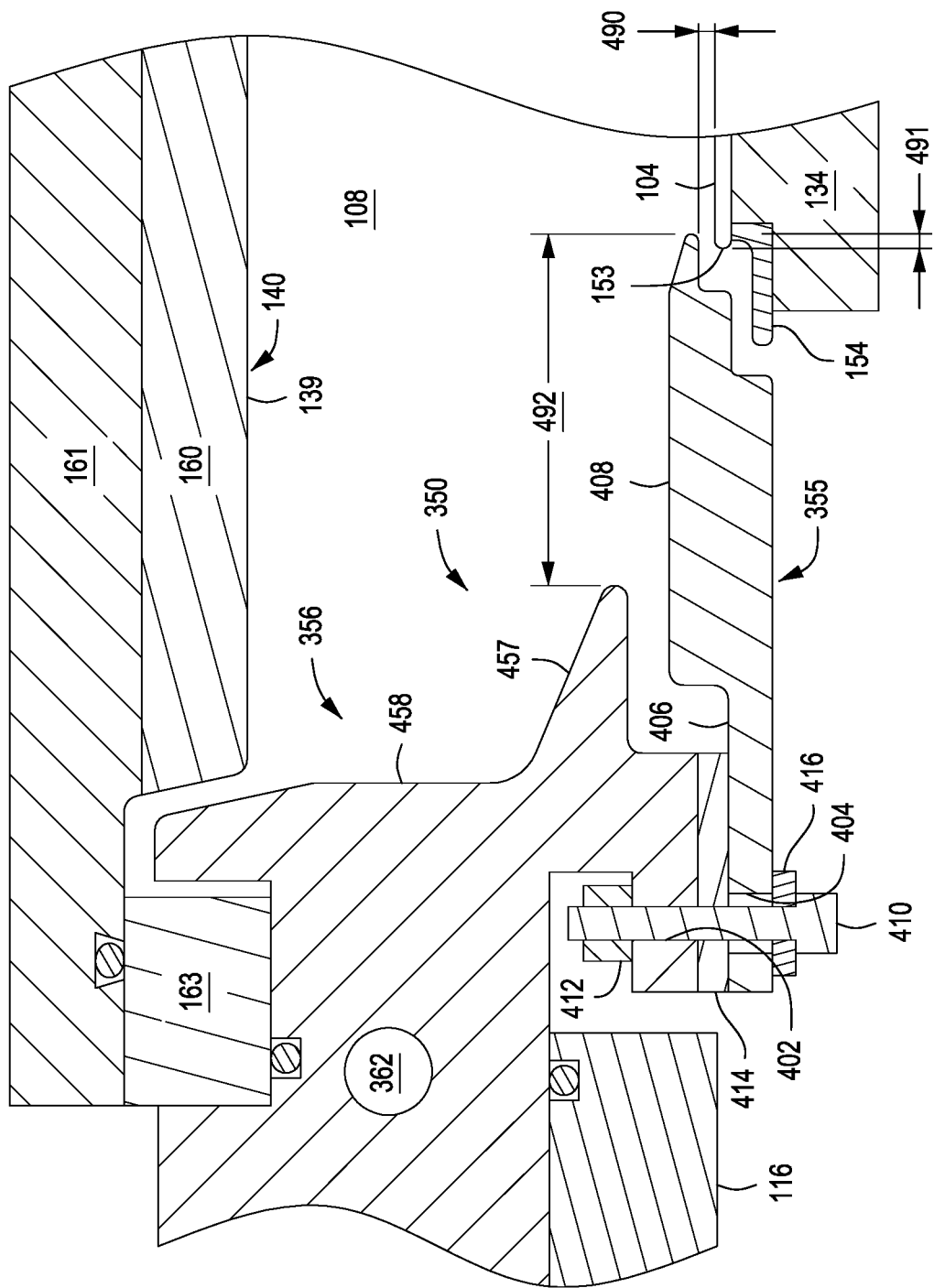
FIG. 4 depicts a schematic cross sectional view of a process kit in accordance with some embodiments of the present disclosure.

FIG. 4 depicts a cross-sectional view of the process kit 350 in accordance with some embodiments of the present disclosure. Referring to FIGS. 3 and 4, in some embodiments, the process kit 350 includes an adapter 356 having an adapter body 458 and a shield portion 457 extending radially inward from a lower portion of the adapter body 458. The adapter body 458 is coupled to and grounded through the chamber sidewalls 116. To facilitate cooling of the adapter 356, a heat transfer channel 362 is formed through the adapter body 458 and is fluidly coupled to a heat transfer medium supply (e.g., heat transfer medium supply 180) to flow a heat transfer medium through the heat transfer channel 362. In some embodiments, the heat transfer medium supply 180 supplies coolant to the heat transfer channel 362 to cool the adapter 356. The adapter 356 may be formed of a thermally conductive material such as, for example, aluminum, stainless steel, copper, and the like.

The process kit 350 also includes a shadow ring 355 having an outer portion 406 coupled to the adapter 356 and an inner portion 408 extending radially inward from the outer portion. The outer portion 406 is coupled to the adapter 356 via a fixation element such as, for example, a plurality of bolts 410 (one shown in cross section of FIG. 4). Each bolt 410 extends through a corresponding first hole 404 in the shadow ring 355 and a corresponding second hole 402 in the adapter 356 aligned with the first hole 404 and is fixed using a retaining plate 412. The diameters of the first and second holes 404, 402 may be larger than a diameter of the bolt 410 to allow for thermal expansion of the bolt 410 during processing and to prevent any possible electrical coupling of the shadow ring 355 to the adapter 356 via the bolt 410, which would ground the shadow ring 355 and result in non-uniformities in the plasma due to a skewed electrical field at the edge of the substrate 104. In some embodiments, a first ceramic insulator 416 may be disposed between the head of the bolt 410 and the shadow ring 355 to ensure that the shadow ring 355 remains electrically isolated from the bolt 410 and the adapter 356. A second ceramic insulator 414 is disposed between the shadow ring 355 and the adapter 356 to electrically insulate the shadow ring 355 from the grounded adapter 356, thus resulting in an electrically floating shadow ring 355.

Unlike the shadow ring 155, the shadow ring 355 depicted in FIGS. 3 and 4 does not include a heat transfer channel for flowing a coolant to cool the shadow ring. Instead, the shield portion 457 extends over the outer portion 406 and at least part of the inner portion 408 of the shadow ring 355. As a result, the majority of heat resulting from processing and deposition is carried by the cooled adapter 356. Furthermore, the coupling of the shadow ring 355 to the adapter 356 also facilitates convective cooling of the shadow ring 355. Because the adapter 356 is grounded, a radially innermost portion of the shield portion 457 should be kept a sufficient distance from the edge of the substrate 104 so as not to cause any plasma non-uniformities proximate the edge of the substrate 104. In some embodiments, the radially innermost portion of the shield portion 457 is spaced apart from the edge of the substrate 104 by a horizontal distance 492 between about 5 mm and about 45 mm. In some embodiments, the horizontal distance 492 is about 35 mm.

In order to help maintain uniformity at the edge of the substrate 104 being processed, a radially innermost portion of the shadow ring 355 is spaced apart from the edge of the substrate 104 by predetermined distances. In some embodiments, the radially innermost portion of the shadow ring 355 is spaced apart from an upper surface of the substrate 104 by a vertical distance 490 between about 0.02 inches and about 0.09 inches. In some embodiments, the vertical distance 490 is about 0.045 inches. In some embodiments, the innermost portion of the shadow ring 355 is spaced apart from the edge of the substrate 104 by a horizontal distance 491 between about 1 mm outside the diameter of the substrate 104 and about 2 mm within the diameter of the substrate. In some embodiments, the horizontal distance 491 is about 1 mm within the diameter of the substrate.

Figure 5:
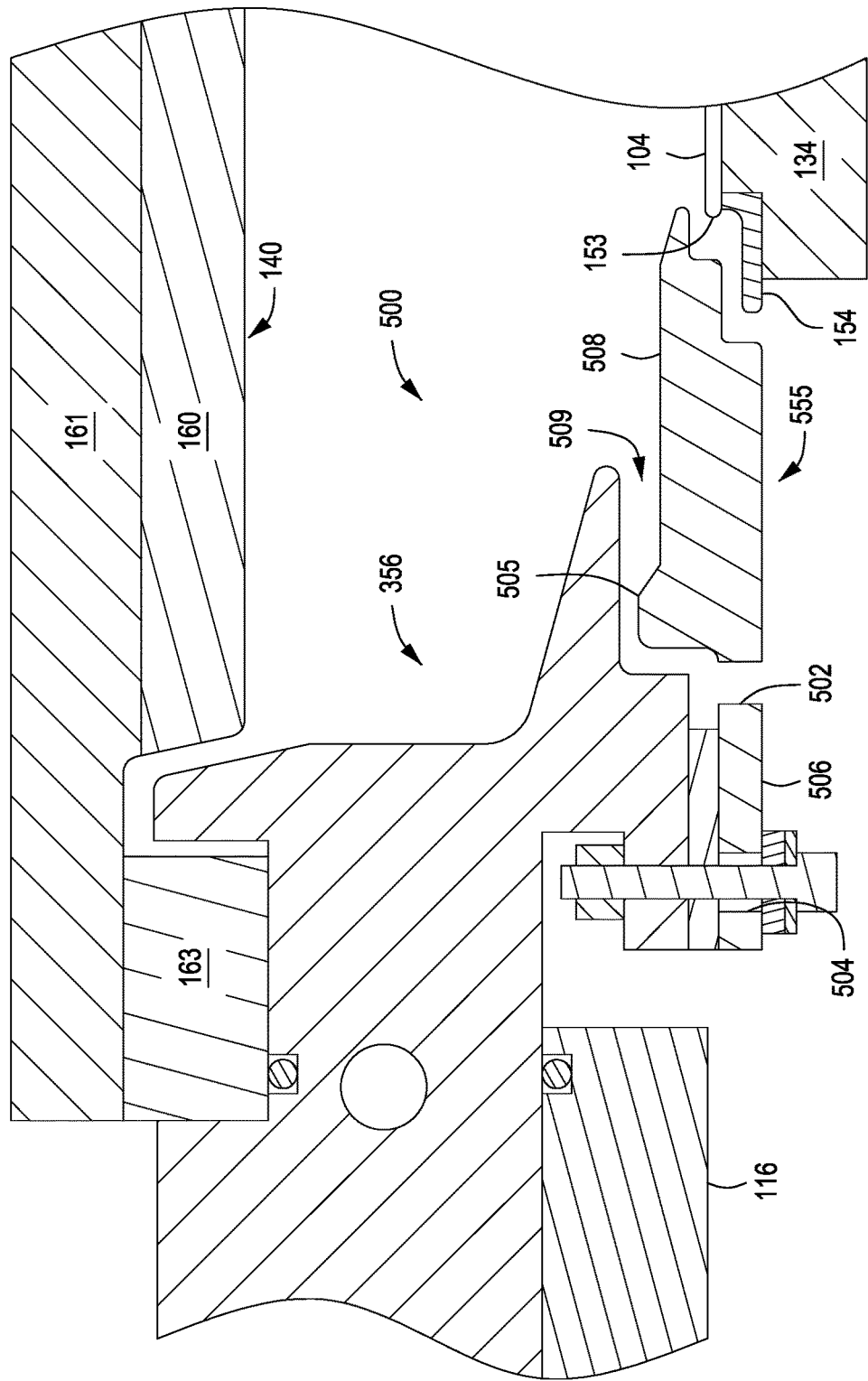
FIG. 5 depicts a schematic cross sectional view of a process kit in accordance with some embodiments of the present disclosure.
Figure 6:
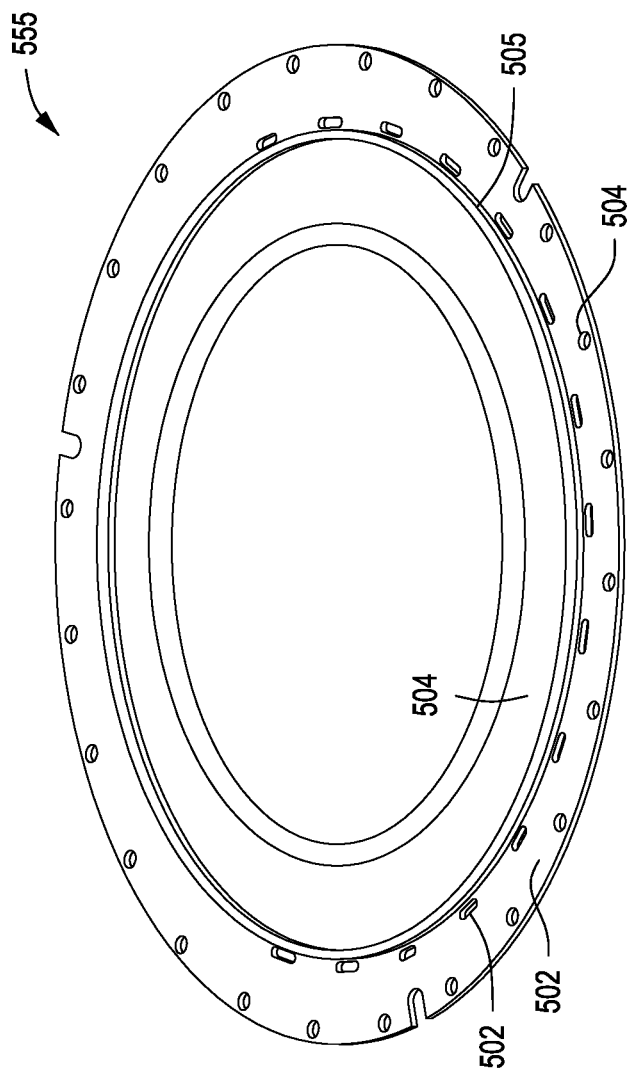
FIG. 6 depicts an isometric view of a shadow ring in accordance with some embodiments of the present disclosure.

FIGS. 4 and 5 illustrate cross-sectional and isometric views of a process kit 500 in accordance with some embodiments of the present disclosure. As noted in FIG. 5, the adapter 356 of the process kit 500 is identical to the adapter 356 described above and, as such, is labeled the same. The process kit 500 includes a shadow ring 555 having an outer portion 506 coupled to the adapter 356 and an inner portion extending radially inward from the outer portion. The shadow ring 555 differs from the shadow ring 355 in that the shadow ring 555 includes an upwardly extending annular protrusion 505 disposed beneath the shield portion to form a tortuous path 509 between the shadow ring 555 and the adapter 356. The shadow ring 555 also includes a plurality of gas conductance holes 502 disposed radially outward of the upwardly extending annular protrusion 505 and is formed in the outer portion 506 to allow a gas to flow through the shadow ring 555. The tortuous path 509 formed by the upwardly extending annular protrusion 505 advantageously prevents stray deposition from entering the space between the shadow ring 555 and the adapter 356.

While the foregoing is directed to embodiments of the present disclosure, other and further embodiments of the disclosure may be devised without departing from the basic scope thereof.

The invention claimed is:

1. A process kit, comprising:
 an adapter having an adapter body and a shield portion radially inward of the adapter body;
 a heat transfer channel formed in the adapter body;
 a shadow ring coupled to the adapter between the adapter body and the shield portion such that the shield portion of the adapter extends over a portion of the shadow ring; and
 a ceramic insulator disposed between the shadow ring and the adapter to electrically isolate the shadow ring from the adapter.

2. The process kit of claim 1, wherein the shadow ring comprises a ring body disposed between the adapter body and shield portion and a protruding section extending radially inward from a lower portion of the ring body to a position radially inward of the shield portion.

3. The process kit of claim 2, wherein the shield portion protrudes downward from the adapter body to cover at least a portion of the ring body.

4. The process kit of claim 2, wherein shadow ring further comprises a second heat transfer channel formed in the ring body.

5. The process kit of claim 1, wherein the shadow ring comprises an outer portion coupled to the adapter and an inner portion extending radially inward from the outer portion.

6. The process kit of claim 5, wherein the shield portion protrudes radially inward from the adapter body to extend over the outer portion and a portion of the inner portion.

7. The process kit of claim 6, wherein the shadow ring further comprises an upwardly extending protrusion disposed beneath the shield portion to form a tortuous path between the shadow ring and the adapter.

8. The process kit of claim 7, wherein the shadow ring further comprises a plurality of gas conductance holes formed in the outer portion to allow a gas to flow through the plurality of gas conductance holes.

9. The process kit of claim 1, wherein the shadow ring is coupled to the adapter via a plurality of bolts extending through the shadow ring, the ceramic insulator, and the adapter.

10. The process kit of claim 1, wherein at least one of the adapter or the shadow ring is formed of aluminum, stainless steel, or copper.

11. A process chamber, comprising:
 a chamber wall defining an inner volume within the process chamber, wherein the chamber wall is grounded;
 a sputtering target disposed in an upper section of the inner volume;
 a substrate support having a support surface to support a substrate below the sputtering target; and
 a process kit, comprising:
  an adapter having an adapter body coupled to the chamber wall and a shield portion radially inward of the adapter body;
  a heat transfer channel formed in the adapter body;
  a shadow ring coupled to the adapter and surrounding the substrate support such that the shield portion of the adapter extends over a portion of the shadow ring; and
  a ceramic insulator disposed between the shadow ring and the adapter to electrically isolate the shadow ring from the adapter, wherein the adapter is disposed on an upper surface of the ceramic insulator.

12. The process chamber of claim 11, wherein the shadow ring is configured so that a radially innermost portion of the shadow ring is above the substrate by between about 0.02 inches to about 0.09 inches.

13. The process chamber of claim 11, wherein the shadow ring is configured so that a radially innermost portion of the shadow ring is disposed between about 2 mm within a diameter of the substrate and about 1 mm outside the diameter of the substrate.

14. The process chamber of claim 11, wherein the shadow ring comprises a ring body and a protruding section extending radially inward from a lower portion of the ring body.

15. The process chamber of claim 14, wherein the shield portion protrudes downward from the adapter body to cover at least a portion of the ring body.

16. The process chamber of claim 14, wherein shadow ring further comprises a second heat transfer channel formed in the ring body.

17. The process chamber of claim 11, wherein the shadow ring comprises an outer portion coupled to the adapter and an inner portion extending radially inward from the outer portion.

18. The process chamber of claim 17, wherein the shield portion protrudes radially inward from the adapter body to extend over the outer portion and a portion of the inner portion.

19. The process chamber of claim 18, wherein the shadow ring further comprises an upwardly extending protrusion disposed beneath the shield portion to form a tortuous path between the shadow ring and the adapter, and wherein the shadow ring further comprises a plurality of gas conductance holes formed in the outer portion to allow a gas to flow through the plurality of gas conductance holes.

20. A process kit, comprising:
an electrically conductive adapter having an adapter body and a shield portion radially inward of the adapter body;
a coolant channel formed in the adapter body;
an electrically conductive shadow ring coupled to the adapter;
a ceramic insulator disposed between the shadow ring and the adapter to electrically isolate the shadow ring from the adapter; and
a deposition ring having an upper surface configured to interface with a lower surface of the shadow ring to form a tortuous path between the deposition ring and the shadow ring, wherein the shield portion extends over a portion of the shadow ring.

* * * * *